(12) United States Patent
Cho et al.

(10) Patent No.: US 9,911,706 B2
(45) Date of Patent: Mar. 6, 2018

(54) SEMICONDUCTOR DEVICE

(71) Applicant: Samsung Electronics Co., Ltd., Suwon-si, Gyeonggi-do (KR)

(72) Inventors: Chang-hyun Cho, Hwaseong-si (KR); Jun-phyo Lee, Yongin-si (KR); Yong-hwan Jeong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/789,247

(22) Filed: Jul. 1, 2015

(65) Prior Publication Data
US 2016/0133586 A1 May 12, 2016

(30) Foreign Application Priority Data

Nov. 11, 2014 (KR) ........................ 10-2014-0156247

(51) Int. Cl.
*H01L 23/48* (2006.01)
*H01L 23/00* (2006.01)
*H01L 21/66* (2006.01)

(52) U.S. Cl.
CPC .............. *H01L 24/06* (2013.01); *H01L 22/32* (2013.01); *H01L 24/05* (2013.01); *H01L 2224/0401* (2013.01); *H01L 2224/04042* (2013.01); *H01L 2224/0562* (2013.01); *H01L 2224/05093* (2013.01); *H01L 2224/05553* (2013.01); *H01L 2224/05557* (2013.01); *H01L 2224/05576* (2013.01); *H01L 2224/05616* (2013.01); *H01L 2224/05644* (2013.01); *H01L 2224/05655* (2013.01); *H01L 2224/05686* (2013.01); *H01L 2224/0603* (2013.01); *H01L 2224/06155* (2013.01); *H01L 2224/06156* (2013.01); *H01L 2224/16225* (2013.01); *H01L 2224/48229* (2013.01); *H01L 2924/181* (2013.01)

(58) Field of Classification Search
CPC ........................ H01L 24/06; H01L 2224/0603
See application file for complete search history.

(56) References Cited

U.S. PATENT DOCUMENTS

| | | | | |
|---|---|---|---|---|
| 5,640,097 A | * | 6/1997 | Hada ................. | G01R 31/2648 324/713 |
| 5,663,651 A | * | 9/1997 | Hada ................. | G01R 31/2648 324/713 |
| 6,121,677 A | * | 9/2000 | Song .................. | H01L 22/32 257/48 |
| 6,770,496 B2 | * | 8/2004 | Hamamura ......... | G01R 31/2818 438/18 |
| 7,323,894 B2 | | 1/2008 | Choi et al. | |
| 7,759,955 B2 | | 7/2010 | Reinwald et al. | |

(Continued)

FOREIGN PATENT DOCUMENTS

JP  3619819 B2  2/2005
KR  10-0280486 B1  11/2000

*Primary Examiner* — A. Sefer
(74) *Attorney, Agent, or Firm* — Harness, Dickey & Pierce, P.L.C.

(57) ABSTRACT

A semiconductor device includes a main pad part and a sub pad part formed in a peripheral area of at least one side of the main pad part. The sub pad part is spaced apart from the main pad part. The sub pad part operates in a first state in which the sub pad part is short-circuited with the main pad part or in a second state in which the sub pad part is open from the main pad part.

11 Claims, 14 Drawing Sheets

(56) References Cited

U.S. PATENT DOCUMENTS

| | | | |
|---|---|---|---|
| 7,863,914 B2 | 1/2011 | Seo et al. | |
| 7,872,940 B2 | 1/2011 | Kwean | |
| 7,880,493 B2 | 2/2011 | Kim et al. | |
| 7,987,402 B2 | 7/2011 | Hur | |
| 8,786,303 B2 | 7/2014 | Kim et al. | |
| 8,878,354 B1* | 11/2014 | Patel | H01L 25/0657 257/686 |
| 9,087,771 B2* | 7/2015 | Iwatsu | H01L 27/0688 |
| 2009/0001367 A1* | 1/2009 | Baek | H01L 23/5382 257/48 |
| 2009/0201028 A1* | 8/2009 | Tsuru | G01R 31/129 324/551 |
| 2009/0224242 A1* | 9/2009 | Cowles | G01R 31/2884 257/48 |
| 2010/0013506 A1* | 1/2010 | Kim | G01R 1/06794 324/762.01 |
| 2011/0089964 A1 | 4/2011 | Seo et al. | |
| 2011/0175634 A1* | 7/2011 | Okamoto | G01R 1/07307 324/750.3 |
| 2012/0162836 A1* | 6/2012 | Furuta | H01L 23/62 361/56 |
| 2012/0229159 A1* | 9/2012 | Kim | G01R 31/2889 324/756.07 |
| 2013/0088251 A1* | 4/2013 | Choi | G01R 3/00 324/756.03 |
| 2014/0097546 A1 | 4/2014 | Oganesian et al. | |
| 2014/0110678 A1* | 4/2014 | Jin | G02F 1/00 257/40 |
| 2014/0151901 A1* | 6/2014 | Iwatsu | H01L 27/0688 257/774 |
| 2015/0332878 A1* | 11/2015 | Ermel | H01H 9/36 218/118 |

* cited by examiner

SEMICONDUCTOR DEVICE

CROSS-REFERENCE TO RELATED APPLICATION

This application claims the benefit of Korean Patent Application No. 10-2014-0156247, filed on Nov. 11, 2014, in the Korean Intellectual Property Office, the disclosure of which is incorporated herein in its entirety by reference.

BACKGROUND

The inventive concept relates to a semiconductor device, and more particularly, to a semiconductor device including a multi-function pad for performing one or more activities by switching.

A process of testing a semiconductor device is performed by applying an electrical signal to pads of the semiconductor device through probe pins and checking whether output data is normal. Recently, as semiconductor devices are miniaturized, repetitive and correct contact of the probe pins is required during a test process, and a method of efficiently using pads in a limited space of the semiconductor device has been discussed.

SUMMARY

The inventive concept provides a multi-function pad capable of efficiently using a limited space of a miniaturized semiconductor device and a semiconductor device including the same.

According to an aspect of the inventive concept, there is provided a semiconductor device including a main pad part, and a sub pad part formed in a peripheral area of at least one side of the main pad part such that the sub pad part is spaced apart from the main pad part. The sub pad part may operate in a first state in which the sub pad part is short-circuited with the main pad part or a second state in which the sub pad part is open from the main pad part.

The sub pad part may have a polygonal, circular, or elliptical ring shape in a top view.

A spacing distance between the main pad part and the sub pad part may be shorter than a width of a probe pin.

The sub pad part may surround the main pad part.

The sub pad part may be formed in a portion of peripheral areas. The portion of the peripheral areas is perpendicular to a scrub direction that is a sliding direction of a probe pin when the probe pin is in contact with the main pad part. The sub pad part may not be formed in another portion of the peripheral areas that is parallel to the scrub direction.

An upper surface of the main pad part and an upper surface of the sub pad part may be located in the same level.

According to another aspect of the inventive concept, there is provided a semiconductor device including a semiconductor substrate having a first circuit unit and a second circuit unit, a plurality of pads on the semiconductor substrate. At least one of the plurality of pads may include a main pad part, an insulating part surrounding edges of the main pad part, and a sub pad part surrounding the insulating part. The semiconductor device may further include a first switching unit for connecting the main pad part and the first circuit unit, and a second switching unit for connecting the sub pad part and the first circuit unit.

The semiconductor device may further include a third switching unit between the sub pad part and the second circuit unit.

The second switching unit may connect the first or second circuit unit and the sub pad part.

The semiconductor device may be in a first state where the main and sub pad parts are connected to the first circuit unit or in a second state where the sub pad part is connected to the second circuit unit.

The semiconductor device may further include an insulating part between the main pad part and the sub pad part such that the insulating part surrounds edges of the main pad part.

The sub pad part may surround an edge of at least one side of the main pad part.

The plurality of pads may have an edge pad structure.

The plurality of pads may have a center pad structure.

An upper surface of at least one of the main pad part and the sub pad part may be located at a higher level than an upper surface of the insulating part.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF EXAMPLE EMBODIMENTS

Figure 1:
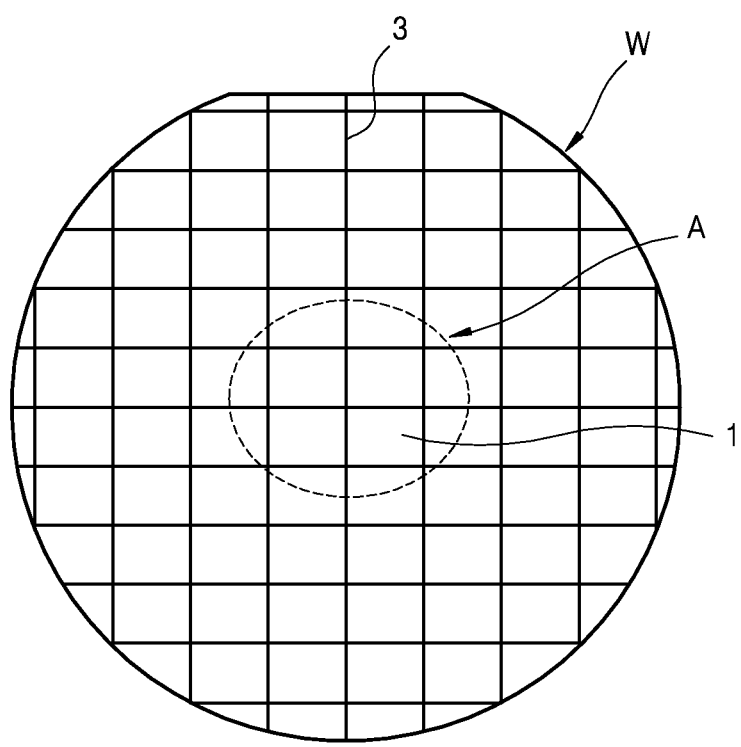
FIG. 1 illustrates a top view of a wafer on which semiconductor devices are formed.

The inventive concept will now be described in detail with reference to the accompanying drawings, in which example embodiments of the inventive concept are shown. Similar reference numerals in the drawings denote similar elements, and thus the repetitive description will be omitted.

Example embodiments of the inventive concept are provided to describe the inventive concept more fully to those of ordinary skill in the art. The example embodiments may, however, be embodied in many different forms and should not be construed as being limited to the example embodiments set forth herein; rather, these example embodiments are provided so that this disclosure will be thorough and complete, and will fully convey the concept of the inventive concept to those of ordinary skill in the art.

Although terms, such as 'first' and 'second', are used to describe various members, regions, layers, parts and/or elements, it is obvious that these members, regions, layers, parts and/or elements cannot be limited by the terms. The terms do not indicate a specific sequence, top and bottom, or superior and inferior and are only used to classify a certain member, region, part, or element from another member, region, part, or element. Therefore, a first member, region, part, or element to be described below can be named a second member, region, part, or element without leaving the introduction of the inventive concept. For example, the first element can be named the second element without leaving from the right scope of the inventive concept, and likely the second element can be named the first element.

All terms used herein including technical or scientific terms have the same meaning as those generally understood by those of ordinary skill in the art unless they are defined differently. It should be understood that terms generally used, which are defined in a dictionary, have the same meaning as in context of related technology, and the terms are not understood as ideal or excessively formal meaning unless they are clearly defined in the application.

When a certain example embodiment can be differently implemented, a specific process sequence may be performed differently from a described sequence. For example, two continuously described processes may be substantially performed at the same time or may be performed in an opposite sequence to a described sequence.

In the drawings, modifications of the shown shapes can be predicted according to, for example, a manufacturing technique and/or tolerance. Therefore, it should not be understood that the example embodiments of the inventive concept are limited to the specific shapes of regions illustrated in the specification, and the example embodiments of the inventive concept should include, for example, a change in shapes caused according to manufacturing.

As used herein, expressions such as "at least one of," when preceding a list of elements, modify the entire list of elements and do not modify the individual elements of the list.

Figure 2:
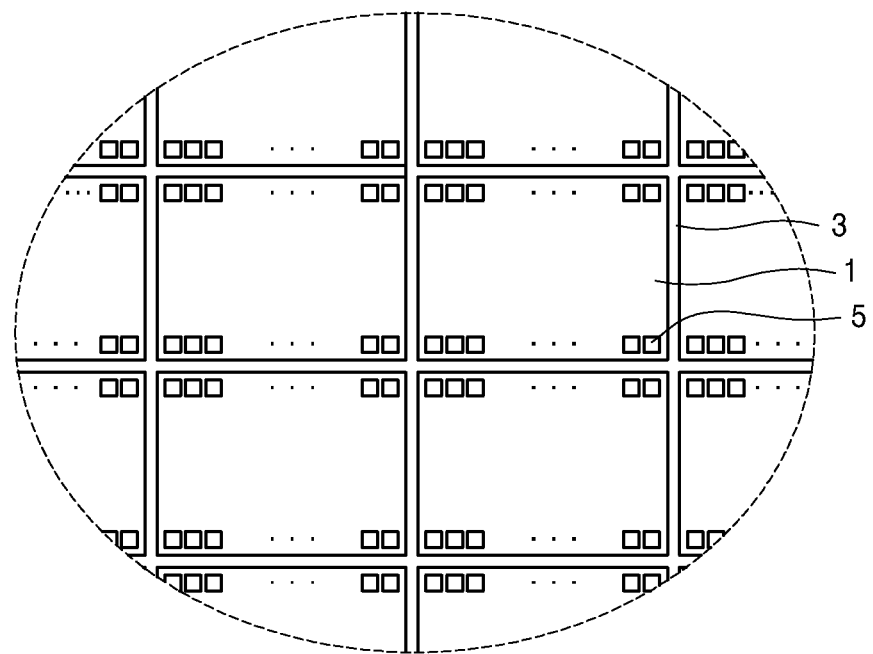
FIG. 2 illustrates a magnified top view of a portion A of FIG. 1.

FIG. 1 illustrates a top view of a wafer W on which a plurality of semiconductor devices 1 are formed, and FIG. 2 illustrates a magnified top view of a portion A of FIG. 1.

Referring to FIGS. 1 and 2, the plurality of semiconductor devices 1, which are formed on the wafer W through a fabrication process, may be separated by a scribe line 3 and manufactured as individual unit chips through an assembly process.

An electrical die sorting (EDS) process of testing electrical characteristics of the plurality of semiconductor devices 1 may be performed between the fabrication process and the assembly process. The EDS process is a process of applying an electrical signal to pads 5 formed along a peripheral part of each of the plurality of semiconductor devices 1 that are formed on the wafer W, and of determining whether the plurality of semiconductor devices 1 are normal based on a signal outputted in response to the applied electrical signal.

A test device may be used for an electrical test on the plurality of semiconductor devices 1 on the wafer W. The test device may include a test head and a probe card to apply an electrical signal to the pads 5 of the plurality of semiconductor devices 1.

Figure 3:
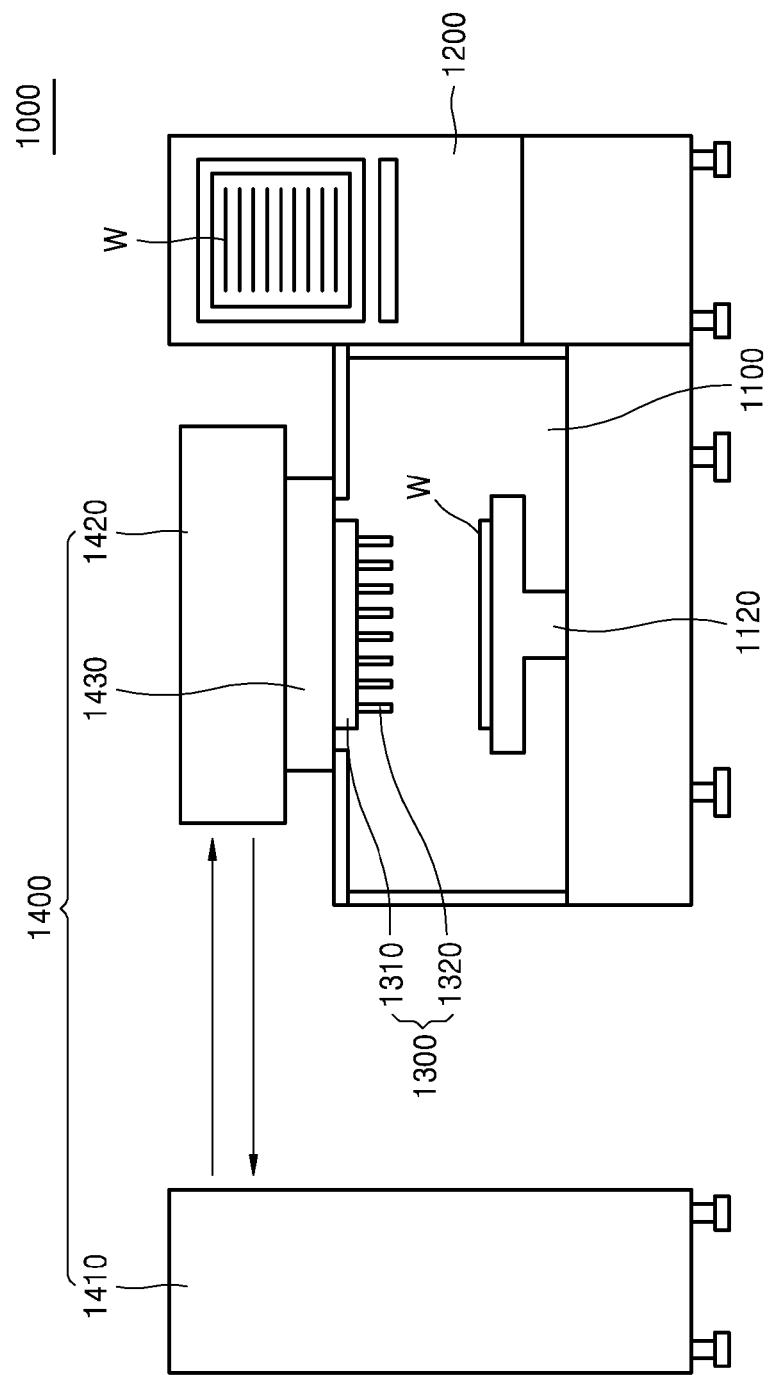
FIG. 3 illustrates a front view of a test device for performing an electrical die sorting (EDS) process.

FIG. 3 illustrates a front view of a test device 1000 for performing the EDS process.

Referring to FIG. 3, the test device 1000 may include a test room 1100, a loader room 1200, a probe card 1300, and a tester 1400.

The test room 1100 may provide a space in which the EDS process of inspecting electrical characteristics of semiconductor devices (not shown) formed on the wafer W is performed.

The probe card 1300 may be located at an upper part of the test room 1100. A wafer support unit 1120 may be disposed inside the test room 1100 such that the wafer support unit 1120 faces the probe card 1300. The wafer W transferred from the loader room 1200 may be seated on the wafer support unit 1120.

The wafer support unit 1120 may not only support the wafer W but also move a position of the wafer W. For example, the wafer support unit 1120 may move in a direction that is perpendicular to a plane formed by the wafer W so that the wafer W is in contact with probe pins 1320 of the probe card 1300. In addition, the wafer support unit 1120 may move or rotate in a direction that is parallel to the plane formed by the wafer W so that an arrangement direction of pads (not shown) formed on the wafer W is aligned in an arrangement direction of the probe pins 1320 of the probe card 1300.

The loader room 1200 may be disposed at one side of the test room 1100 such that the loader room 1200 is adjacent to the test room 1100. The loader room 1200 may provide a space in which wafers W to be tested are stored. The wafers W in the loader room 1200 may be transferred one by one to the wafer support unit 1120 in the test room 1100 by a moving means (not shown).

The probe card 1300 may be an intermediate medium for delivering an electrical signal between the tester 1400 and the wafer W on which semiconductor devices are formed because it is very difficult to directly connect between the tester 1400 for generating the electrical signal and each semiconductor device since a size of each of the semiconductor devices formed on the wafer W is very tiny.

The probe card 1300 may include a main circuit board 1310 and the probe pins 1320. The main circuit board 1310 may have a circular disc shape, and a plurality of male or female connectors (not shown) may be formed on an upper surface of the main circuit board 1310 along a circumferential direction.

The plurality of male or female connectors of the main circuit board 1310 may be zero force insertion (ZIF) coupled to a base 1430 of the tester 1400 by a ZIF ring (not shown), thereby coupling the probe card 1300 to the tester 1400.

The probe pins 1320 may be physically and/or electrically in contact with pads (not shown) formed on each of the semiconductor devices of the wafer W. The probe card 1300 may deliver the electrical signal to each of the semiconductor devices through the probe pins 1320.

The probe card 1300 may include thousands of probe pins 1320 to simultaneously test the semiconductor devices of the wafer W. Accordingly, it is required for accuracy of a test to determine whether the probe pins 1320 have proper contact positions with the pads of each of the semiconductor devices, and the semiconductor devices according to example embodiments of the inventive concept may efficiently detect contact positions with the probe pins 1320 in a limited space of the wafer W. A detailed description thereof will be made below with reference to FIG. 4.

The tester 1400 may include a test main body 1410, a test head 1420 electrically connected to the test main body 1410, and the base 1430 coupled to the probe card 1300.

The test main body 1410 may apply an electrical signal for testing a semiconductor device to the probe card 1300 via the test head 1420 and the base 1430. The test main body 1410 may determine whether the semiconductor device is abnormal by receiving from the probe card 1300 a signal that is to be checked when the applied electrical signal passes through the semiconductor device.

The base 1430 may have a hollowed ring shape, and the probe card 1300 may be coupled to a lower surface of the base 1430 through the ZIF ring or the like. A structure of the base 1430 may vary according to a shape of the probe card 1300.

Figure 4:
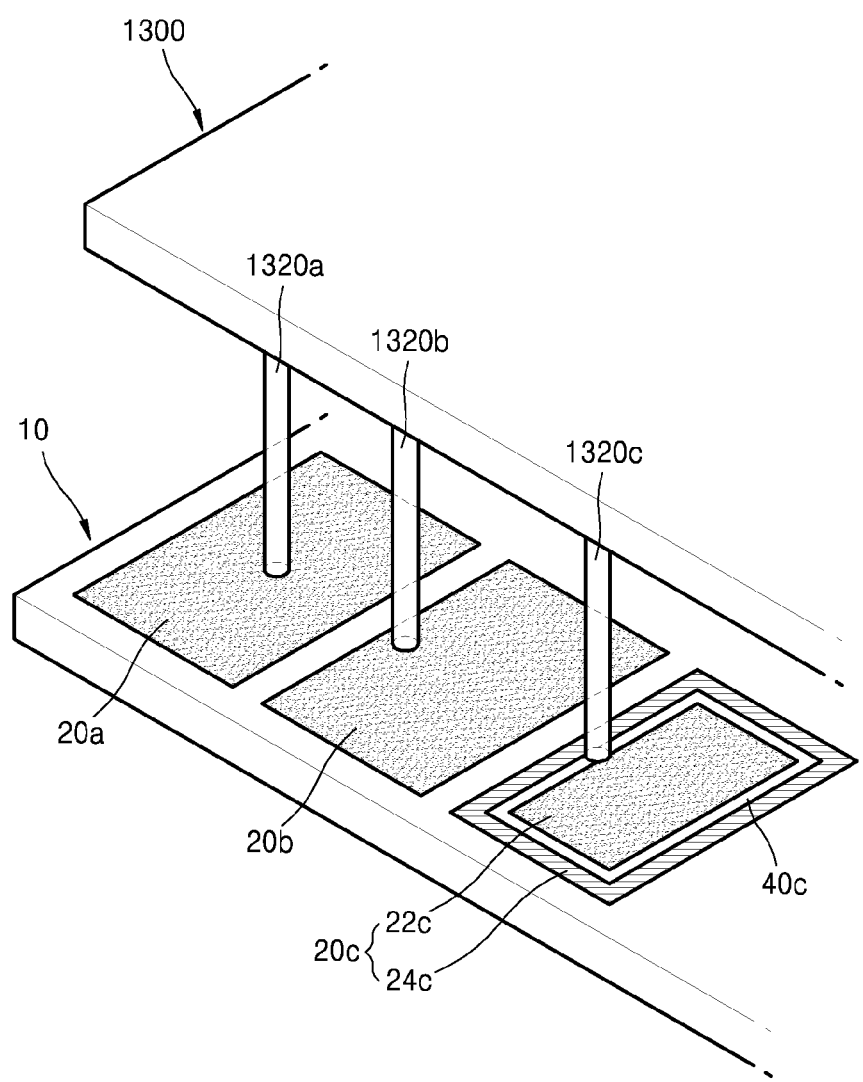
FIG. 4 illustrates a perspective view showing a state where a probe card described with reference to FIG. 3 is in contact with a semiconductor device.

FIG. 4 illustrates a perspective view showing a state where the probe card 1300 described with reference to FIG. 3 is in contact with a semiconductor device 10, according to an example embodiment of the inventive concept. In FIG. 4, similar reference numerals in FIGS. 1 to 3 denote similar elements, and thus the repetitive description will be omitted for conciseness of description.

In the present example embodiment, the probe card 1300, first to third probe pins 1320a, 1320b, and 1320c, and the semiconductor device 10 are simplified for convenience of description, and shapes or sizes of the probe card 1300, the first to third probe pins 1320a, 1320b, and 1320c, and the semiconductor device 10 are not limited to the present example embodiment.

Referring to FIG. 4, the first to third probe pins 1320a, 1320b, and 1320c provided in the probe card 1300 may be in contact with first to third pads 20a, 20b, and 20c of the semiconductor device 10, respectively.

The semiconductor device 10 may be one of the semiconductor devices 1 described with reference to FIG. 1. The semiconductor device 10 may have the first to third pads 20a, 20b, and 20c connected to an internal circuit (not shown) of the semiconductor device 10 to input/output an electrical signal from/to the outside.

In the present example embodiment, it will be described as an example that the first and second pads 20a and 20b are single-function pads, and the third pad 20c is a multi-function pad including a main pad part 22c and a sub pad part 24c. The multi-function pad will be described below with reference to FIGS. 5A and 5B.

According to contact positions of the first to third probe pins 1320a, 1320b, and 1320c respectively in contact with the first to third pads 20a, 20b, and 20c, the first probe pin 1320a may be in contact with a central region of the first pad 20a, and the second and third probe pins 1320b and 1320c may be respectively in contact with edge regions of the second and third pads 20b and 20c.

Like the second and third probe pins 1320b and 1320c, when a contact position of a probe pin is located at an edge region of a pad, there may be a problem in reliability due to a bad contact or the like during a packaging process after an EDS process. The semiconductor device 10 may be determined as "spec in" even though a central position of the third pad 20c is not a right position (corresponding to a position of the third probe pin 1320c) if the third pad 20c is in contact with the third probe pin 1320c during the EDS process. However, there is a high possibility of a bad contact with another semiconductor device (not shown), a substrate (not shown), or the like which may be connected through the third pad 20c during the packaging process if the central position of the third pad 20c is not the right position.

Like the first pad 20a or the second pad 20b, when a pad in contact with a probe pin is a single-function pad, it is difficult to detect a contact position of the probe pin, and accordingly, reliability in determination on whether the semiconductor device 10 is abnormal during the EDS process may also be lowered.

According to the present example embodiment, the third pad 20c may include the main pad part 22c and the sub pad part 24c surrounding the main pad part 22c to detect a contact position of the third probe pin 1320c. An insulating part 40c may be interposed between the main pad part 22c and the sub pad part 24c.

The EDS process may include a contact position detection process for detecting a contact position between the third probe pin 1320c and the third pad 20c.

In detail, during at least a partial process of the EDS process, the sub pad part 24c may be used to detect a contact position between the third probe pin 1320c and the third pad 20c. For example, the sub pad part 24c may be open from the main pad part 22c and may act as a separate pad from the main pad part 22c. That is, the sub pad part 24c may be used to determine whether the third probe pin 1320c is in contact with an edge region of the third pad 20c, i.e., a region where the sub pad part 24c is located, thereby increasing reliability of the EDS process.

When the succeeding EDS process after the contact position detection process is performed, or when the packaging process or the like is performed after the EDS process is completed, the sub pad part 24c may be short-circuited with the main pad part 22c and may act as a native pad required in the semiconductor device 10. Accordingly, a separate sensing pad does not have to be provided to detect contact positions of the first to third probe pins 1320a, 1320b, and 1320c during the EDS process. After the contact position detection process, the sub pad part 24c may act as a native pad required in the semiconductor device 10 together with the main pad part 22c, thereby efficiently using a limited space of a wafer.

Figure 5A:
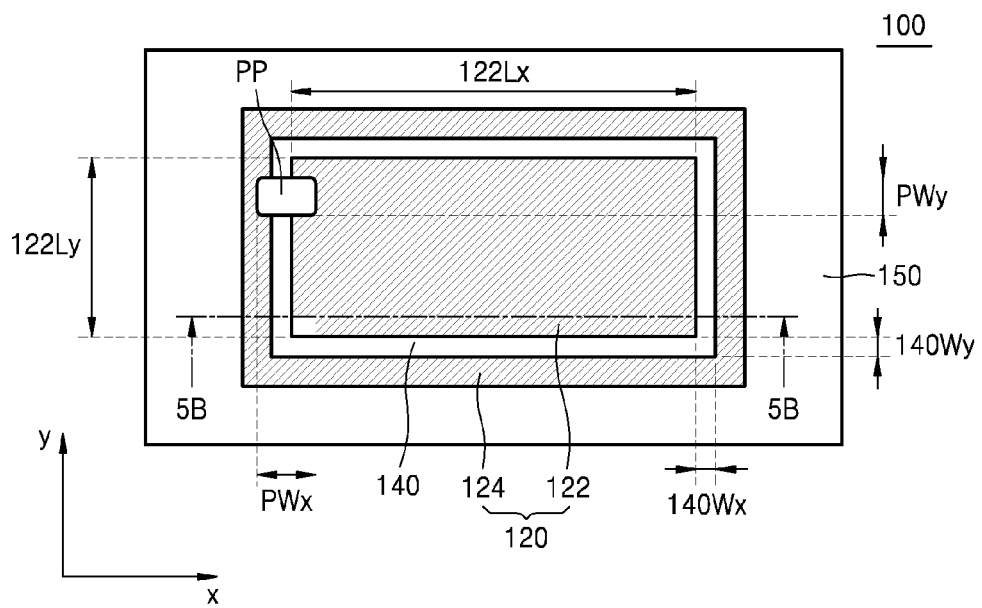
FIG. 5A illustrates a top view of a semiconductor device according to an example embodiment of the inventive concept.
Figure 5B:
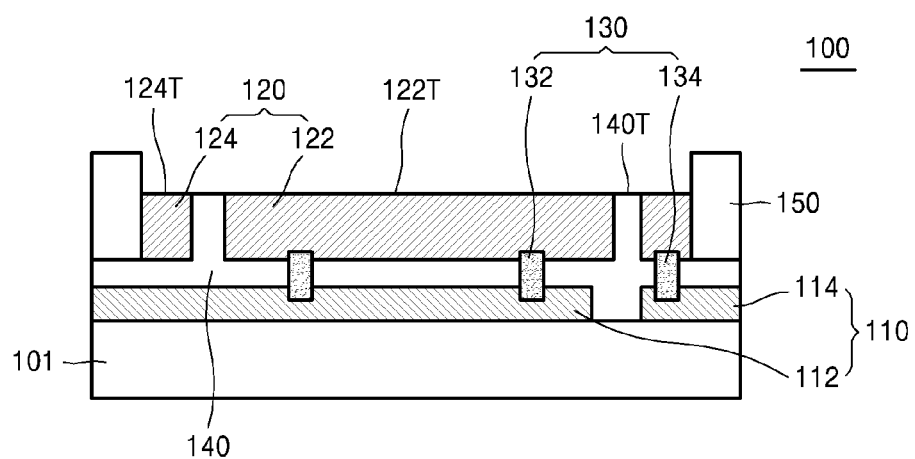
FIG. 5B illustrates a cross-sectional view along line 5B-5B of FIG. 5A.

FIG. 5A illustrates a top view of a semiconductor device 100 according to an example embodiment of the inventive concept. FIG. 5B illustrates a cross-sectional view along line 5B-5B of FIG. 5A. In FIGS. 5A and 5B, similar reference numerals in FIGS. 1 to 4 denote similar elements, and thus the repetitive description will be omitted for conciseness of description.

Referring to FIGS. 5A and 5B, the semiconductor device 100 may include a semiconductor substrate 101, a circuit pattern layer 110 on the semiconductor substrate 101, a multi-function pad 120 connected to the circuit pattern layer 110 through a plug 130, an insulating part 140, and a mold part 150. The semiconductor device 100 may be one of the semiconductor devices for performing various functions, such as a memory, a logic, a microprocessor, an analog device, a digital signal processor, and a system on chip.

The semiconductor substrate 101 may include, for example, crystalline silicon (Si), polycrystalline Si, or amorphous Si. According to other one or more example embodiments, the semiconductor substrate 101 may include a semiconductor, such as germanium (Ge), or a compound semiconductor, such as SiGe, silicon carbide (SiC), gallium arsenide (GaAs), indium arsenide (InAs), or indium phosphide (InP).

Although not shown, the semiconductor substrate 101 may include an active area defined by a device separation layer, source/drain areas formed in the active area, a gate electrode, and the like.

The circuit pattern layer 110 may be a wiring pattern formed on the semiconductor substrate 101, and may be a metal wiring or a metal foil of aluminum (Al), copper (Cu), or the like. According to one or more example embodiments, a surface of the circuit pattern layer 110 may be plated by tin (Sb), gold (Au), nickel (Ni), lead (Pb), or the like.

The circuit pattern layer 110 may include a first circuit pattern 112 connected to a main pad part 122 and a second circuit pattern 114 connected to a sub pad part 124. The first circuit pattern 112 may be connected to a first switching unit SW1 to be described below with reference to FIG. 6, and the second circuit pattern 114 may be connected to a second switching unit SW2 to be described below with reference to FIG. 6.

Although it is shown in the present example embodiment that the circuit pattern layer 110 has a single-layer structure on the semiconductor substrate 101, the present example embodiment is not limited thereto. For example, the circuit pattern layer 110 may have a multi-layer structure or a structure buried in the semiconductor substrate 101. In addition, although it is shown that the circuit pattern layer 110 is in contact with an upper surface of the semiconductor substrate 101, an insulating layer (not shown) may be interposed between the circuit pattern layer 110 and the semiconductor substrate 101.

The multi-function pad 120 may include the main pad part 122 and the sub pad part 124. The multi-function pad 120 may be formed on the circuit pattern layer 110 and connected to the circuit pattern layer 110 through the plug 130 formed of tungsten (W) or the like. In detail, the main pad part 122 may be connected to the first circuit pattern 112 through a main plug 132, and the sub pad part 124 may be connected to the second circuit pattern 114 through a sub plug 134.

The main pad part 122 may have various shapes, such as a polygonal, circular, or elliptical shape, in a top view (on an x-y plane of FIG. 5A). For example, the main pad part 122 may have a rectangular shape in which a length 122Lx in a first direction (x-axis direction) is longer than a length 122Ly in a second direction (y-axis direction), as shown in FIG. 5A. Herein, the first direction (x-axis direction) may be a sliding direction of a probe pin PP when the probe pin PP is in contact with the multi-function pad 120, i.e., a scrub direction.

In the top view (on the x-y plane of FIG. 5A), the main pad part 122 may be surrounded by the insulating part 140 and the sub pad part 124. For example, the sub pad part 124 may be spaced apart from the main pad part 122 and may have a rectangular ring shape surrounding the main pad part 122. However, the shape of the sub pad part 124 is not limited thereto and may have various ring shapes, such as a polygonal, circular, or elliptical shape.

The main pad part 122 and the sub pad part 124 may be a metal foil of Al, Cu, or the like. According to one or more example embodiments, a surface of the main pad part 122 or the sub pad part 124 may be plated by Sb, Au, Ni, Pb, or the like. The main pad part 122 and the sub pad part 124 may be formed of the same material but are not limited thereto.

A space spacing between the main pad part 122 and the sub pad part 124 may be filled with the insulating part 140. The insulating part 140 may be interposed between the main pad part 122 and the sub pad part 124, and may act to electrically insulate the main pad part 122 from the sub pad part 124. The insulating part 140 may be formed of, for example, silicon oxide, silicon nitride, silicon oxynitride, or the like.

According to one or more example embodiments, a width 140Wx of the insulating part 140 in the first direction (x-axis direction) may be less than a width PWx of the probe pin PP in the first direction (x-axis direction). A width 140Wy of the insulating part 140 in the second direction (y-axis direction) may also be less than a width PWy of the probe pin PP in the second direction (y-axis direction).

According to one or more example embodiments, the width 140Wx of the insulating part 140 in the first direction (x-axis direction) may be the same as the width 140Wy of the insulating part 140 in the second direction (y-axis direction).

An upper surface 140T of the insulating part 140, an upper surface 122T of the main pad part 122, and an upper surface 124T of the sub pad part 124 may be in the same level.

The mold part 150 may be formed to cover the semiconductor device 100 while exposing at least a portion of the multi-function pad 120, to protect the semiconductor device 100 from an external environment, and to alleviate a shock applied to the semiconductor device 100 during succeeding processes of a packaging process and the like.

According to one or more example embodiments, the mold part 150 may be formed of photo sensitive polyimide (PSPI).

Figure 6:
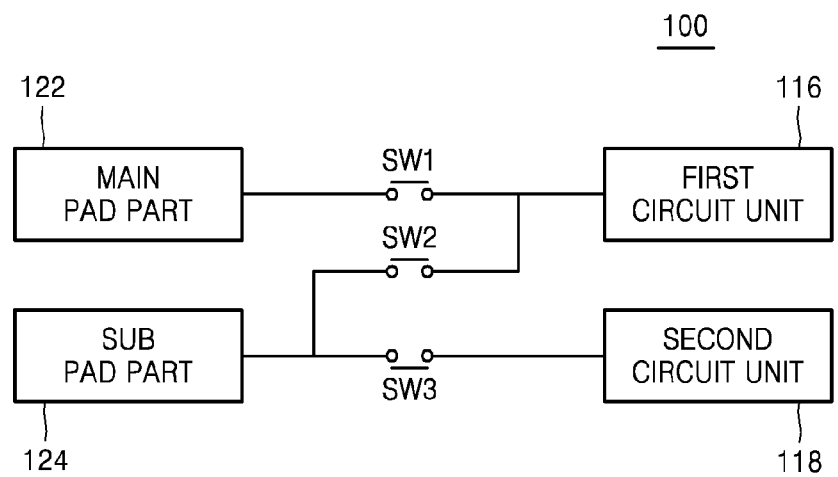
FIG. 6 illustrates a block diagram of a circuit structure of a semiconductor device, according to an example embodiment of the inventive concept.

FIG. 6 illustrates a block diagram of a circuit structure of the semiconductor device 100, according to an example embodiment of the inventive concept. In FIG. 6, similar reference numerals in FIGS. 1 to 5B denote similar elements, and thus the repetitive description will be omitted for conciseness of description.

Referring to FIG. 6, the semiconductor device 100 may include the main pad part 122, the sub pad part 124, a first circuit unit 116, a second circuit unit 118, and first to third switching units SW1, SW2, and SW3 for connecting the main and sub pad parts 122 and 124 and the first and second circuit units 116 and 118.

According to one or more example embodiments, the main pad part 122 may be connected to the first circuit unit 116 through the first switching unit SW1. That is, when the first switching unit SW1 is in an on state, the main pad part 122 may deliver input and output signals between the outside of the semiconductor device 100 and the first circuit unit 116. The first circuit unit 116 may perform, for example, a native role required in the semiconductor device 100.

The sub pad part 124 may be connected to the first circuit unit 116 through the second switching unit SW2. That is, when the second switching unit SW2 is in an on state, the sub pad part 124 may deliver input and output signals between the outside of the semiconductor device 100 and the first circuit unit 116. When both the first switching unit SW1 and the second switching unit SW2 are in the on state, the main pad part 122 and the sub pad part 124 may be short-circuited with each other, and may be connected to the first circuit unit 116 to deliver input and output signals between the outside of the semiconductor device 100 and the first circuit unit 116.

The sub pad part 124 may be connected to the second circuit unit 118 through the third switching unit SW3. When the third switching unit SW3 is in an on state, the sub pad part 124 may deliver input and output signals between the outside of the semiconductor device 100 and the second circuit unit 118. The second circuit unit 118 may perform, for example, a role of detecting a contact position of the probe pin PP (refer to FIG. 5A) and delivering a contact position detection result to the test device 1000 (refer to FIG. 3). According to one or more example embodiments, when the third switching unit SW3 is in the on state, the second switching unit SW2 may be in an off state.

Although not shown, as described with reference to FIGS. 5A and 5B, the main pad part 122 may be connected to the first switching unit SW1 via the first circuit pattern 112 (refer to FIGS. 5A and 5B), and the sub pad part 124 may be connected to the second and third switching units SW2 and SW3 via the second circuit pattern 114 (refer to FIGS. 5A and 5B).

As described above, the semiconductor device 100 according to the present example embodiment may include the first, second, and third switching units DW1, SW2, and SW3 for connecting the main and sub pad parts 122 and 124 and the first and second circuit units 116 and 118 so that each of the main and sub pad parts 122 and 124 performs various roles according to circumstances.

For example, during the contact position detection process described with reference to FIGS. 1 to 4, the second switch SW2 may maintain in the off state, and the third switching unit SW3 may maintain in the on state, thereby detecting a probe pin contact position.

After the contact position detection process is completed, the first and second switches SW1 and SW2 may maintain in the on state, and the third switch SW3 may maintain in the off state, so that not only the main pad part 122 but also the sub pad part 124 perform a native pad role required in the semiconductor device 100.

Figure 7:
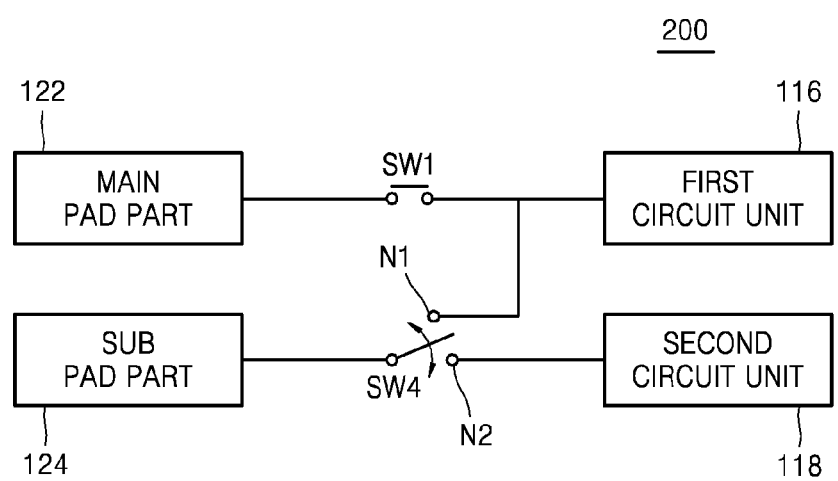
FIG. 7 illustrates a block diagram of a circuit structure of a semiconductor device, according to another example embodiment of the inventive concept.

FIG. 7 illustrates a block diagram of a circuit structure of a semiconductor device 200, according to another example embodiment of the inventive concept. In FIG. 7, similar reference numerals in FIGS. 1 to 6 denote similar elements, and thus the repetitive description will be omitted for conciseness of description.

Referring to FIG. 7, the semiconductor device 200 may include the main pad part 122, the sub pad part 124, the first circuit unit 116, the second circuit unit 118, and first and fourth switching units SW1 and SW4 for connecting the main and sub pad parts 122 and 124 and the first and second circuit units 116 and 118.

The semiconductor device 200 may have a similar structure to that of the semiconductor device 100 described with reference to FIG. 6 but may differ from the semiconductor device 100 in that the semiconductor device 200 includes the fourth switching unit SW4 instead of the second and third switching units SW2 and SW3.

The fourth switching unit SW4 may be connected to a first node N1 or a second node N2 to connect between the sub pad part 124 and the first circuit unit 116 or between the sub pad part 124 and the second circuit unit 118.

That is, similar to the description made with reference to FIG. 6, during the contact position detection process, the fourth switching unit SW4 may be connected to the second node N2 so that a probe pin contact position is detected.

After the contact position detection process is completed, the fourth switching unit SW4 may be connected to the first node N1 so that not only the main pad part 122 but also the sub pad part 124 perform a native pad role required in the semiconductor device 200.

Figure 8A:
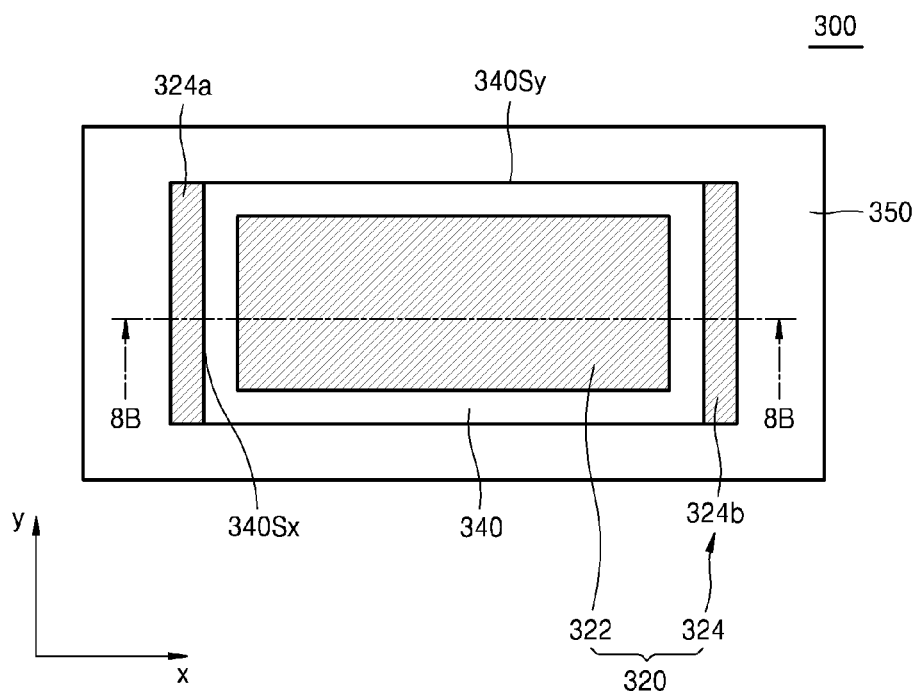
FIG. 8A illustrates a top view of a semiconductor device according to another example embodiment of the inventive concept.
Figure 8B:
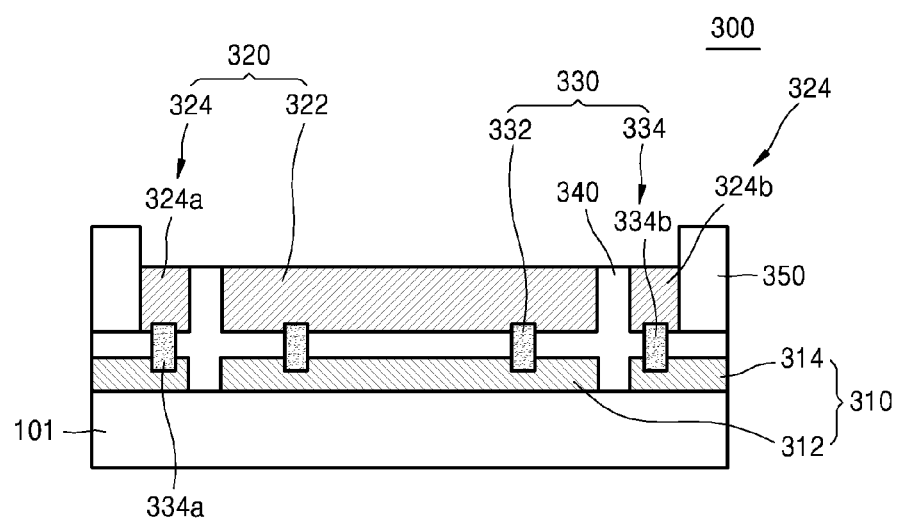
FIG. 8B illustrates a cross-sectional view along line 8B-8B of FIG. 8A.

FIG. 8A illustrates a top view of a semiconductor device 300 according to another example embodiment of the inventive concept. FIG. 8B illustrates a cross-sectional view along line 8B-8B of FIG. 8A. In FIGS. 8A and 8B, similar reference numerals in FIGS. 1 to 7 denote similar elements, and thus the repetitive description will be omitted for conciseness of description.

Referring to FIGS. 8A and 8B, the semiconductor device 300 may include the semiconductor substrate 101, a circuit pattern layer 310 on the semiconductor substrate 101, a multi-function pad 320 connected to the circuit pattern layer 310 through a plug 330, an insulating part 340, and a mold part 350.

The semiconductor device 300 according to the present example embodiment may slightly differ from the semiconductor device 100 described with reference to FIGS. 5A and 5B with respect to a structure of the multi-function pad 320. The circuit pattern layer 310, the insulating part 340, and the mold part 350 may have similar structures and perform similar roles to those of the circuit pattern layer 110, the insulating part 140, and the mold part 150 of FIGS. 5A and 5B.

The insulating part 340 may surround a main pad part 322 as well as the insulating part 140 described with reference to FIGS. 5A and 5B. However, a sub pad part 324 may be formed in some of peripheral areas of the insulating part 340.

For example, the sub pad part 324 may be formed in peripheral areas 340Sx that are perpendicular to the first direction (x-axis direction), and may not be formed in peripheral areas 340Sy that are perpendicular to the second direction (y-axis direction), among the whole peripheral areas of the insulating part 340. Herein, the first direction (x-axis direction) may be a sliding direction of a probe pin (not shown) when the probe pin is in contact with the multi-function pad 320, i.e., a scrub direction.

First and second sub pad parts 324a and 324b formed in both the side peripheral areas 340Sx may be connected to a second circuit pattern 314 through separate sub plugs 334a and 334b.

Since miss alignment frequently occurs in the scrub direction when the probe pin is in contact with the multi-function pad 320, the sub pad part 324 according to the present example embodiment may be used to detect a probe pin contact position in the scrub direction (x-axis direction), and may also reduce an area of the multi-function pad 320 occupied in the semiconductor device 300.

Figure 9:
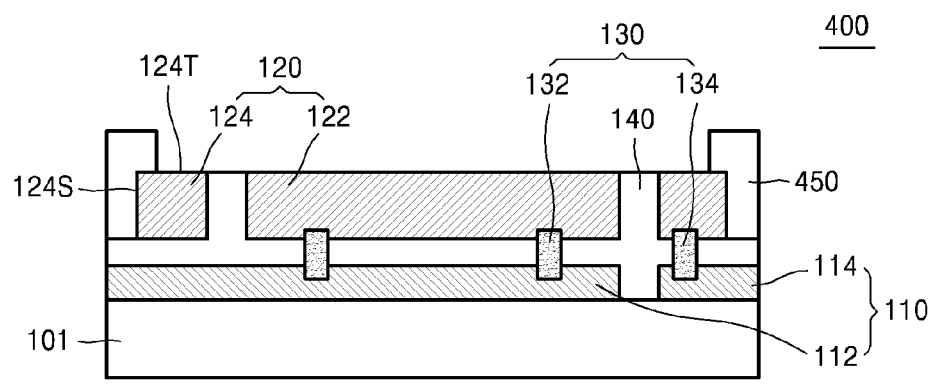
FIGS. 9 and 10 illustrate cross-sectional views of semiconductor devices, according to other example embodiments of the inventive concept.
Figure 10:
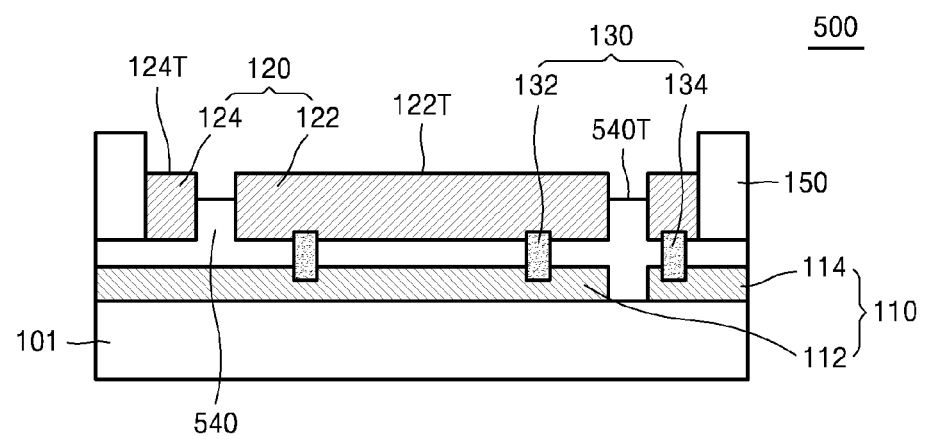

FIGS. 9 and 10 illustrate cross-sectional views of semiconductor devices 400 and 500, according to other example embodiments of the inventive concept. In FIGS. 9 and 10, similar reference numerals in FIGS. 1 to 8B denote similar elements, and thus the repetitive description will be omitted for conciseness of description.

Referring to FIGS. 9 and 10, each of the semiconductor devices 400 and 500 may have similar structures and perform similar roles to those of the semiconductor device 100 described with reference to FIGS. 5A and 5B except for a structural difference in a mold part 450 or an insulating part 540.

FIG. 9 is a cross sectional view of the semiconductor device 400 for describing that a mold part 450 of the semiconductor device 400 is not limited to the mold parts 150 and 350 described with reference to FIGS. 1 to 8B and may have various structures. As shown in FIG. 9, the mold part 450 may be formed to cover not only a side surface 124S of the sub pad part 124 but also at least a partial region of the upper surface 124T of the sub pad part 124.

FIG. 10 is a cross sectional view of the semiconductor device 500 describing that an insulating part 540 of the semiconductor device 500 is not limited to the insulating part 140 and 340 described with reference to FIGS. 1 to 8B and may have various structures. As shown in FIG. 10, an upper surface 540T of the insulating part 540 may be located in a lower level than the upper surface 122T of the main pad part 122 and the upper surface 124T of the sub pad part 124.

According to the present example embodiment, when the upper surface 540T of the insulating part 540 is located in a lower level than the upper surface 122T of the main pad part 122 and the upper surface 124T of the sub pad part 124, the possibility that a probe pin (not shown) is in contact with the upper surface 540T of the insulating part 540 during an EDS process and is thus damaged may be reduced.

Figure 11:
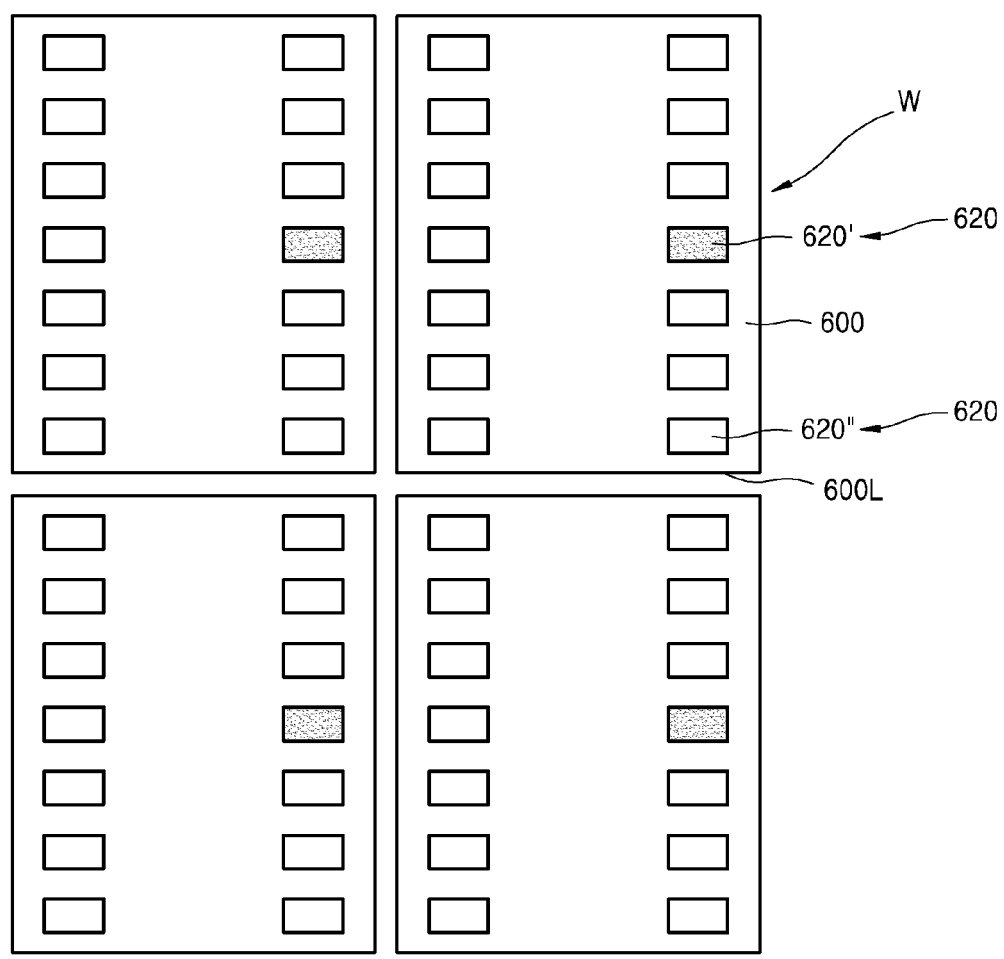
FIGS. 11 to 13 illustrate cross-sectional views of semiconductor devices, according to example embodiments of the inventive concept.
Figure 12:
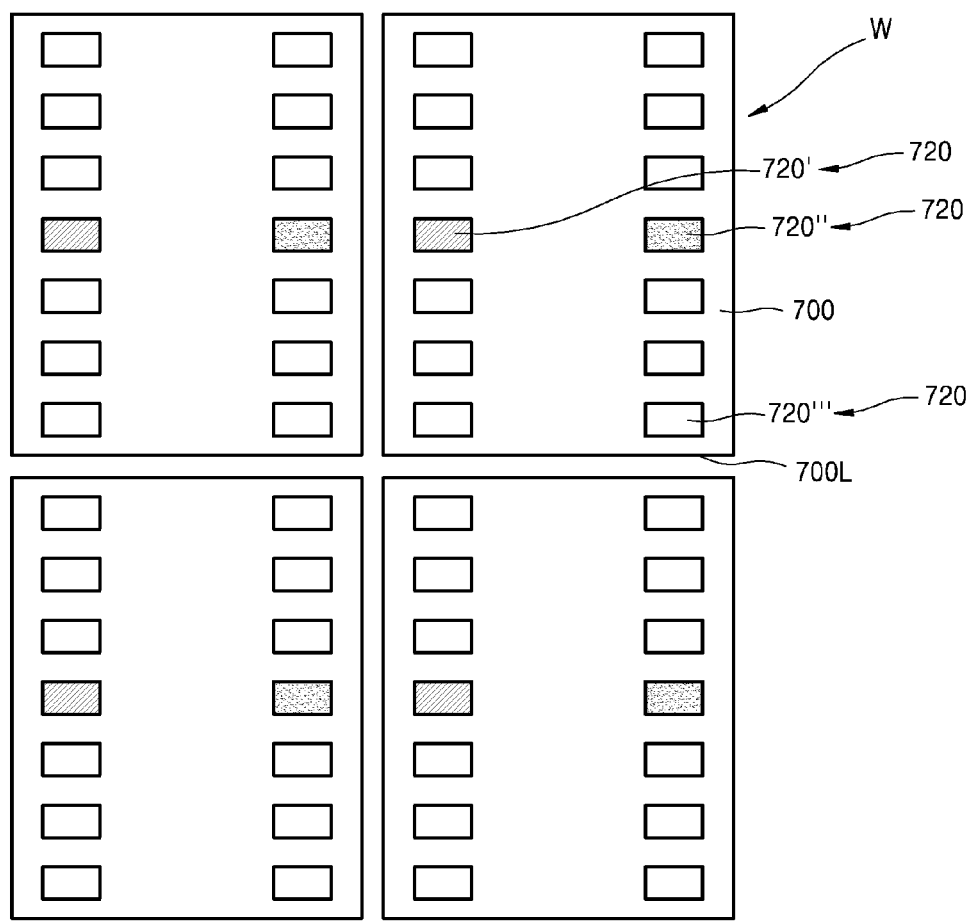
Figure 13:
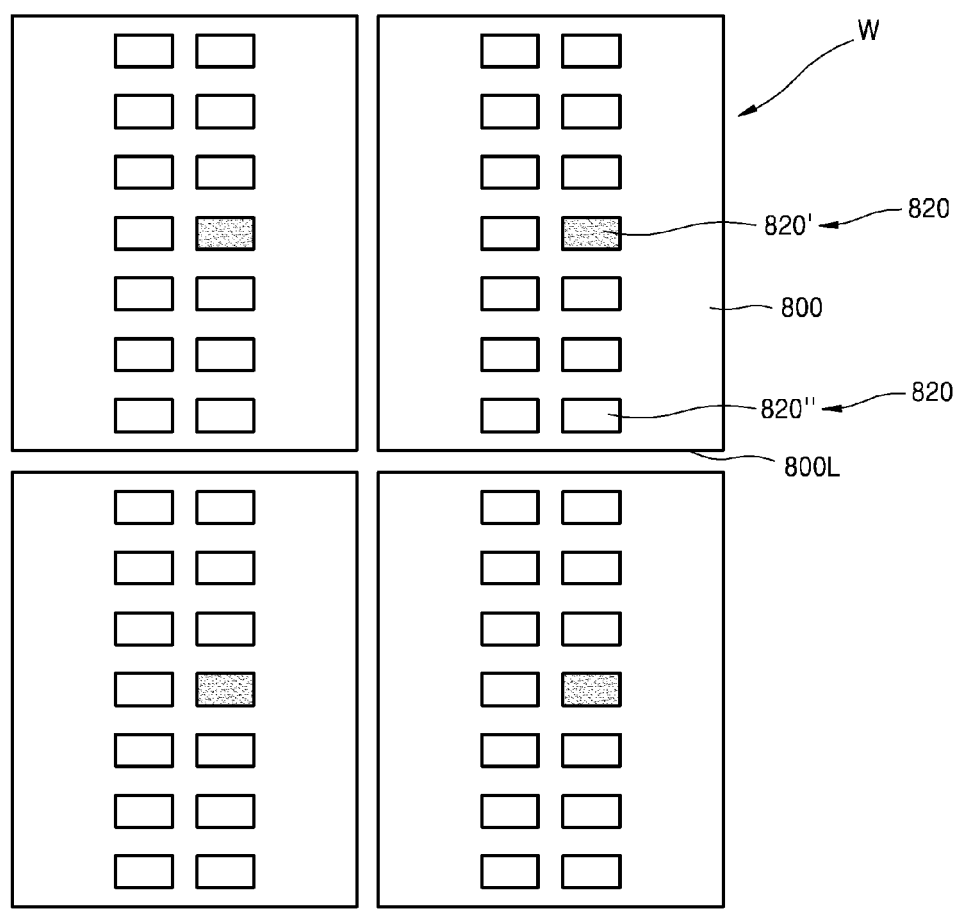

FIGS. 11 to 13 illustrate cross-sectional views of semiconductor devices 600, 700, and 800, according to example embodiments of the inventive concept. In FIGS. 11 to 13, similar reference numerals in FIGS. 1 to 10 denote similar elements, and thus the repetitive description will be omitted for conciseness of description.

Referring to FIG. 11, a plurality of semiconductor devices 600 separated by a scribe line 600L are formed on a wafer W, and a plurality of pads 620 may be located in edge regions of each of the plurality of semiconductor devices 600.

According to one or more example embodiments, at least one of the plurality of pads 620 may be a multi-function pad 620' having a similar structure to that of any one of the multi-function pads 120, 220, and 320 described with reference to FIGS. 1 to 10. That is, the multi-function pad 620' may include a main pad part (not shown) and a sub pad part (not shown), and the other pads 620" may be single-function pads for performing a native role required in the semiconductor device 600.

Referring to FIG. 12, a plurality of semiconductor devices 700 separated by a scribe line 700L may be formed on a wafer W, and a plurality of pads 720 may be located in edge regions of each of the plurality of semiconductor devices 700.

According to one or more example embodiments, at least one of the plurality of pads 720 may be a multi-function pad 720' having a similar structure to that of any one of the multi-function pads 120, 220, and 320 described with reference to FIGS. 1 to 10. In addition, at least one of the plurality of pads 720 may be a multi-function pad 720" having a structure different from that of the multi-function pad 720'.

That is, each of the multi-function pads 720' and 720" may include a main pad part (not shown) and a sub pad part (not shown), and the other pads 720'" may be single-function pads for performing a native role required in the semiconductor device 600.

Referring to FIG. 13, a plurality of semiconductor devices 800 separated by a scribe line 800L may be formed on a wafer W, and a plurality of pads 820 may be located in a central region of each of the plurality of semiconductor devices 800.

The plurality of semiconductor devices 800 may have a similar structure to those of the semiconductor devices 600 and 700, and may differ from the semiconductor devices 600 and 700 only in a location where the plurality of pads 820 are formed. That is, the semiconductor devices 600 and 700 of FIGS. 11 and 12 may have an edge pad structure in which the plurality of pads 620 and 720 are located in the edge regions of the semiconductor devices 600 and 700, respectively, but the semiconductor device 800 according to the present example embodiment may have a center pad structure in which the plurality of pads 820 are located in a center part of the semiconductor device 800.

At least one of the plurality of pads 820 having the center pad structure may be a multi-function pad 820' having a similar structure to that of any one of the multi-function pads 120, 220, and 320 described with reference to FIGS. 1 to 10. That is, the multi-function pad 820' may include a main pad part (not shown) and a sub pad part (not shown), and the other pads 820" may be single-function pads for performing a native role required in the semiconductor device 600.

According to the present example embodiment, when the semiconductor device 800 has the center pad structure, a circuit layout inside the semiconductor device 800 may be simplified and may be thus suitable for miniaturization.

Figure 14:
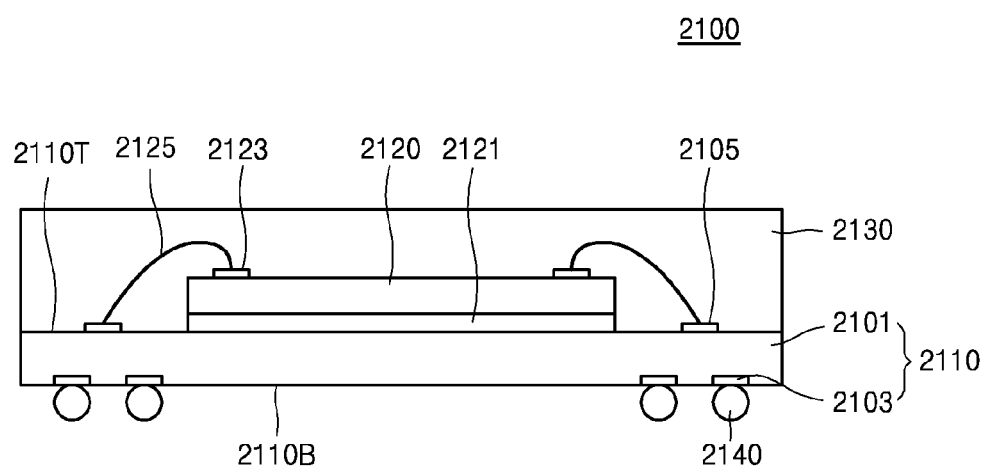
FIG. 14 illustrates a cross-sectional view of a semiconductor package including semiconductor devices according to an example embodiments of the inventive concept.

FIG. 14 illustrates a cross-sectional view of a semiconductor package 2100 including semiconductor devices according to example embodiments of the inventive concept. In FIG. 14, similar reference numerals in FIGS. 1 to 13 denote similar elements, and thus the repetitive description will be omitted for conciseness of description.

Referring to FIG. 14, the semiconductor package 2100 may include a printed circuit board 2110, a semiconductor chip 2120 mounted on an upper surface 2110T of the printed circuit board 2110, a mold part 2130 formed to cover the upper surface 2110T of the printed circuit board 2110 and the semiconductor chip 2120, and a solder ball 2140 attached to a lower surface 2110B of the printed circuit board 2110.

The semiconductor chip 2120 may be mounted on the upper surface 2110T of the printed circuit board 2110.

According to one or more example embodiments, the semiconductor chip 2120 may be any one of the semiconductor devices 100, 200, 300, 400, 500, 600, 700, and 800 described with reference to FIGS. 1 to 13. The semiconductor chip 2120 may be one of the semiconductor chips for performing various functions, such as a memory, a logic, a microprocessor, an analog device, a digital signal processor, and a system on chip. Alternatively, the semiconductor chip 2120 may be a multi-chip having a structure in which two or more semiconductor chips are stacked. For example, the two or more semiconductor chips may be the same type of memory devices, or one of the two or more semiconductor chips may be a memory device, and another may be a microcontroller device.

Figure 15:
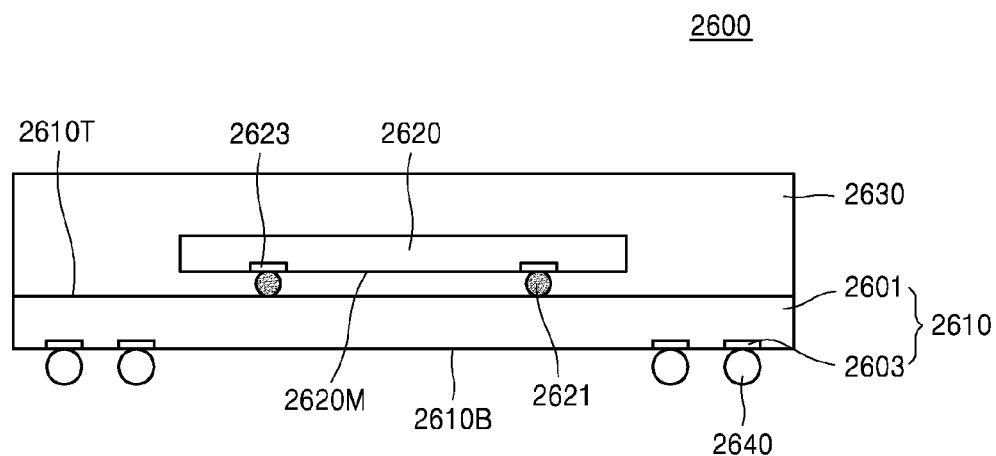
FIG. 15 illustrates a cross-sectional view of a semiconductor package including semiconductor devices according to example embodiments of the inventive concept.

The semiconductor chip 2120 may be mounted by wire bonding as shown in FIG. 14 or by flip-chip bonding (refer to FIG. 15).

According to one or more example embodiments, at least one of chip-conductive pads 2123 may be any one of the multi-function pads 120, 220, and 320 described with reference to FIGS. 1 to 10.

The mold part 2130 may protect the semiconductor chip 2120 and a bonding wire 2125 from risky elements of an external environment by sealing the semiconductor chip 2120 and the bonding wire 2125 while covering the upper surface 2110T of the printed circuit board 2110.

The mold part 2130 may be formed using a molding resin which may include an epoxy-group molding resin, a polyimide-group molding resin, or the like.

FIG. 15 illustrates a cross-sectional view of a semiconductor package 2600 including semiconductor devices according to example embodiments of the inventive concept. In FIG. 15, similar reference numerals in FIGS. 1 to 14 denote similar elements, and thus the repetitive description will be omitted for conciseness of description.

Referring to FIG. 15, the semiconductor package 2600 may include a printed circuit board 2610, a semiconductor chip 2620 mounted on an upper surface 2610T of the printed circuit board 2610, a plurality of bumps 2621 connecting between the printed circuit board 2610 and the semiconductor chip 2620, a mold part 2630 formed to cover the upper surface 2610T of the printed circuit board 2610 and the semiconductor chip 2620, and a solder ball 2640 attached to a lower surface 2610B of the printed circuit board 2610.

The semiconductor chip 2620 may be mounted on the upper surface 2610T of the printed circuit board 2610.

Unlike the semiconductor chip 2120 described with reference to FIG. 14, the semiconductor chip 2620 according to the present example embodiment may be mounted such that a main surface 2620M on which a chip-conductive pad 2623 is formed faces the printed circuit board 2610.

According to one or more example embodiments, the semiconductor chip 2620 may be any one of the semiconductor devices 100, 200, 300, 400, 500, 600, 700, and 800 described with reference to FIGS. 1 to 13. The semiconductor chip 2620 may be one of the semiconductor chips for performing various functions, such as a memory, a logic, a microprocessor, an analog device, a digital signal processor, and a system on chip (SoC).

As shown in FIG. 15, when the semiconductor chip 2620 is mounted by a flip-chip bonding method, the semiconductor chip 2620 may be coupled to the printed circuit board 2610 through the bump 2621 formed on the chip-conductive pad 2623.

According to one or more example embodiments, at least one of chip-conductive pads 2623 may be any one of the multi-function pads 120, 220, and 320 described with reference to FIGS. 1 to 10.

In the semiconductor package 2600 of the flip-chip bonding method, the mold part 2630 may be formed through a molded under fill (MUF) process.

Figure 16:
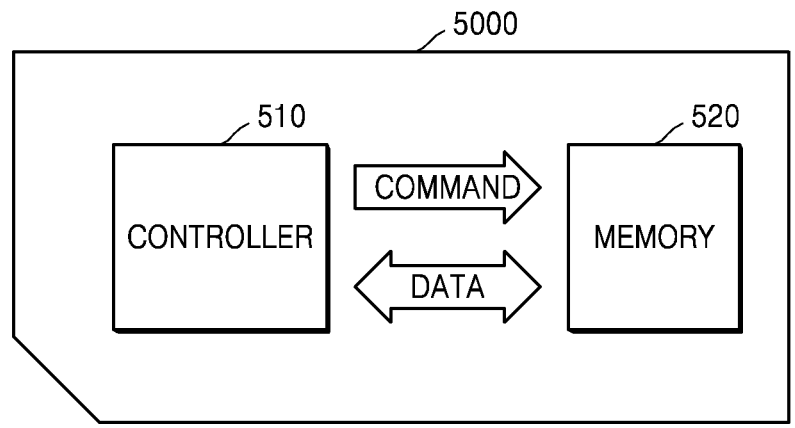
FIG. 16 illustrates a block diagram of a memory card including semiconductor devices according to example embodiments of the inventive concept.

FIG. 16 illustrates a block diagram of a memory card 5000 including semiconductor devices according to example embodiments of the inventive concept.

Referring to FIG. 16, the memory card 5000 may include a controller 510 and a memory 520.

The controller 510 and the memory 520 may be arranged such that the controller 510 and the memory 520 exchange electrical signals. For example, if the controller 510 transmits a command to the memory 520, the memory 520 may transmit data to the controller 510.

At least one of the controller 510 and the memory 520 may include at least one of the semiconductor devices 100, 200, 300, 400, 500, 600, 700, and 800 described with reference to FIGS. 1 to 13.

The memory card 5000 may be used for various portable electronic devices, e.g., memory devices such as a multimedia card (MMC) and a secure digital (SD) card.

Figure 17:
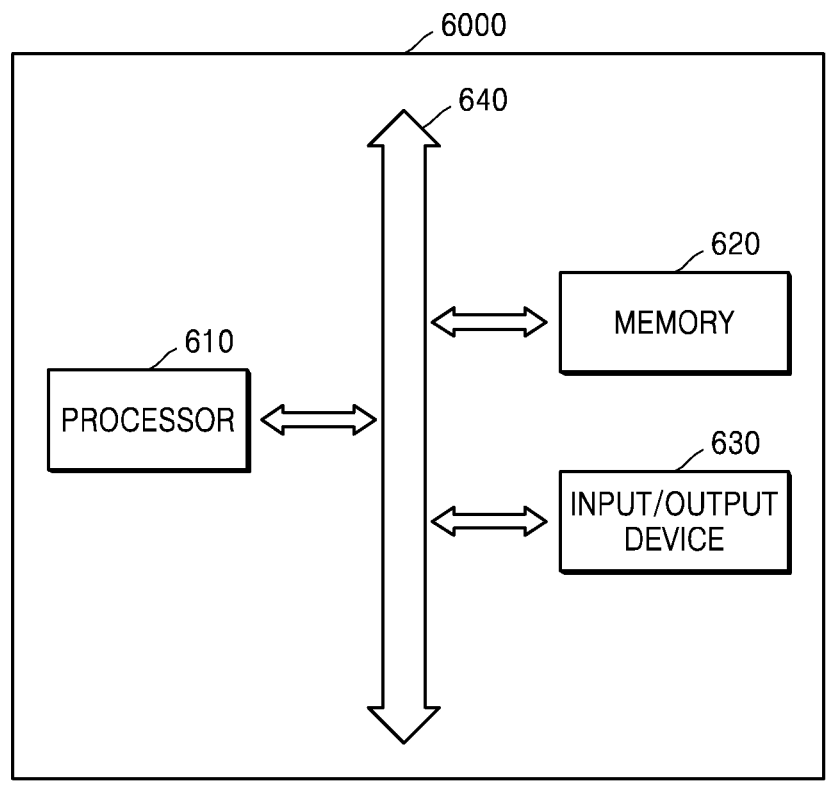
FIG. 17 illustrates a block diagram of a system including semiconductor devices according to example embodiments of the inventive concept.

FIG. 17 illustrates a block diagram of a system 6000 including semiconductor devices according to example embodiments of the inventive concept.

Referring to FIG. 17, the system 6000 may include a processor 610, a memory 620, an input/output device 630, and a bus 640. The processor 610, the input/output device 630, and the memory 620 may perform data communication with each other by using the bus 640.

The processor 610 may execute a program and may control the system 6000.

The memory 620 may store codes and data for an operation of the processor 610. At least one of the processor 610 and the memory 620 may include at least one of the semiconductor devices 100, 200, 300, 400, 500, 600, 700, and 800 described with reference to FIGS. 1 to 13.

The input/output device 630 may be used to input or output data of the system 6000. The system 6000 may exchange data with an external device, e.g., a PC or a network, by being connected to the external device using the input/output device 630.

The system 6000 may be used for mobile phones, MP3 players, navigation machines, solid state drives (SSDs), and other various electronic devices.

Figure 18:
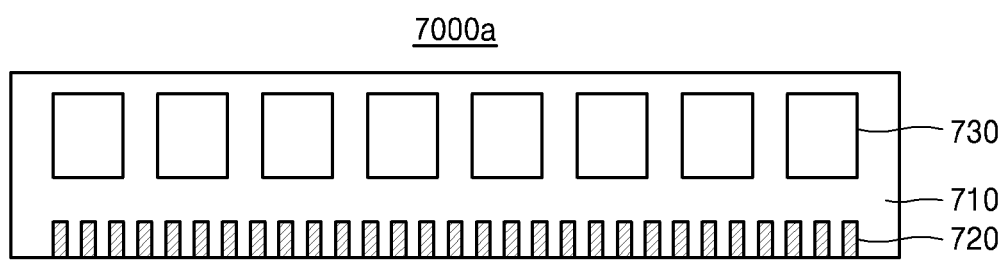
FIG. 18 illustrates a top view of a semiconductor module including semiconductor devices according to example embodiments of the inventive concept.

FIG. 18 illustrates a top view of a semiconductor module 7000a including semiconductor devices according to example embodiments of the inventive concept.

Referring to FIG. 18, the semiconductor module 7000a may include a module board 710, a plurality of contact terminals 720, and a plurality of semiconductor packages 730.

The plurality of contact terminals 720 may be formed a side surface of the module board 710 and may be electrically connected to the plurality of semiconductor packages 730. The plurality of semiconductor packages 730 may be mounted on the module board 710, and at least one of the plurality of semiconductor packages 730 may include at least one of the semiconductor devices 100, 200, 300, 400, 500, 600, 700, and 800 described with reference to FIGS. 1 to 13.

While the inventive concept has been particularly shown and described with reference to example embodiments thereof, it will be understood that various changes in form and details may be made therein without departing from the spirit and scope of the following claims.

What is claimed is:

1. A semiconductor device comprising:
a substrate;
a circuit pattern layer on the substrate; and
a multi-function pad connected to the circuit pattern layer through a plug, the multi-function pad including a main pad part and a sub pad part, the sub pad part in a peripheral area of at least one side of the main pad part, the sub pad part being spaced apart from the main pad part, and the sub pad part being configured to electrically switch between a first state and a second state, the first state being a state in which the sub pad part is short-circuited with the main pad part, and the second state being a state in which the sub pad part is open from the main pad part.

2. The semiconductor device of claim 1, wherein the sub pad part has a polygonal, circular, or elliptical ring shape in a top view.

3. The semiconductor device of claim 1, wherein a spacing distance between the main pad part and the sub pad part is shorter than a width of a probe pin.

4. The semiconductor device of claim 1, wherein the sub pad part surrounds the main pad part.

5. The semiconductor device of claim 1, wherein the sub pad part is formed in a first peripheral areas among peripheral areas of the main pad part, and is not formed in a second peripheral areas among the peripheral areas of the main pad part, the first peripheral areas being perpendicular to a scrub direction that is a sliding direction of a probe pin when the probe pin is in contact with the main pad part, the second peripheral areas being parallel to the scrub direction.

6. The semiconductor device of claim 1, wherein an upper surface of the main pad part and an upper surface of the sub pad part are located in a same level.

7. A system on chip (SoC) comprising:

a substrate;

a circuit pattern layer on the substrate, the circuit pattern including a first circuit pattern and a second circuit pattern;

a multi-function pad connected to the circuit pattern layer, the multi-function pad including a main pad part and a sub pad part, the main pad part being connected to the first circuit pattern via a main plug, and the sub pad part being connected to second circuit pattern via a sub plug, the sub pad part being configured to electrically switch between a first state and a second state, the first state being a state in which the sub pad part is short-circuited with the main pad part, and the second state being a state in which the sub pad part is open from the main pad part; and an insulating part disposed between the main pad part and the sub pad part.

8. The SoC of claim 7, wherein the sub pad part is formed in a peripheral area of at least one side of the main pad part.

9. The SoC of claim 7, further comprising:

a first switching unit connected to the first circuit pattern; and a second switching unit connected to the second circuit pattern.

10. The SoC of claim 9, wherein the first switching unit and the second switching unit are configured to connect the main pad part and the sub pad part with the first circuit pattern and the second circuit pattern, respectively.

11. The SoC of claim 7, wherein the sub pad part surrounds the main pad part.

* * * * *